US006650527B1

United States Patent
Pinto

(10) Patent No.: US 6,650,527 B1
(45) Date of Patent: Nov. 18, 2003

(54) ARTICLE COMPRISING A CASIMIR FORCE MODULATOR AND METHODS THEREFOR

(76) Inventor: Fabrizio Pinto, 115 N. Fifth Ave., Monrovia, CA (US) 91016

( * ) Notice: Subject to any disclaimer, the term of this patent is extended or adjusted under 35 U.S.C. 154(b) by 190 days.

(21) Appl. No.: 09/903,312

(22) Filed: Jul. 11, 2001

Related U.S. Application Data

(60) Provisional application No. 60/217,335, filed on Jul. 11, 2000.

(51) Int. Cl.[7] ............................. G01P 15/00; H05H 3/00
(52) U.S. Cl. ...................... 361/233; 250/251; 250/296; 318/555; 318/558; 361/226
(58) Field of Search ................................ 250/251, 296; 361/233, 226; 318/555, 558

(56) References Cited

PUBLICATIONS

WO 02/054030 A2, PCT/US01/50356, Fabrizio Pinto, "Method and Apparatus for Controlling Dispersion Forces", priority filing Dec. 12, 2000.*

* cited by examiner

Primary Examiner—Nikita Wells
(74) Attorney, Agent, or Firm—DeMont & Breyer, LLC

(57) ABSTRACT

Method and apparatus for modulating the direction and magnitude of the Casimir force between two bodies. In accordance with the illustrative embodiment, a repulsive Casimir force is generated by placing two bodies in near-proximity to one another. For one of the bodies, dielectric properties predominate; for the other, magnetic properties predominate. The arrangement further includes a device that alters the dielectric or magnetic properties of the bodies. By altering the dielectric or magnetic properties, the repulsive Casimir force can be made to decrease, then vanish, then reappear as an attractive force. Modulating the Casimir force in such a manner can be used to control stiction in MEMS devices and to accelerate particles, among many other applications.

6 Claims, 3 Drawing Sheets

ARTICLE COMPRISING A CASIMIR FORCE MODULATOR AND METHODS THEREFOR

STATEMENT OF RELATED APPLICATIONS

This application claims the benefit of U.S. provisional application serial No. 60/217,335, filed Jul. 11, 2000, entitled "Article Comprising a Casimir Force Modulator and Methods Therefor," which is also incorporated herein by reference.

FIELD OF THE INVENTION

The present invention pertains to articles and methods that generate repulsive forces and/or alternating repulsive/attractive forces.

BACKGROUND OF THE INVENTION

It is a well-known consequence of quantum field theory that two neutral, polarizable objects attract each other via forces that are generally referred to as dispersion forces. Examples of such forces include the van der Waals force, the Casimir force, and the Casimir-Polder force. Such forces are responsible, wholly or in part, for the mutual attraction of atoms and molecules at relatively large distances from each other, for the attraction of neutral atoms to surfaces, and for the attraction between two polished surfaces at sub-micron distances.

This last phenomenon manifests itself in the area of micro-electro-mechanical systems (MEMS) engineering as an unwanted latching of micron-sized parts to one another during fabrication and operation. Such latching, commonly referred to as stiction, has been and remains a roadblock to the development or proper functioning of micro-devices since it is usually impossible to separate the parts involved once stiction occurs. Special fabrication techniques are employed to reduce the incidence of stiction during fabrication. And avoiding stiction during normal operation usually requires that the structural properties of a micro-device satisfy some basic requirements of rigidity and a minimum spacing between parts.

Efforts that have been directed to the characterization and control of stiction have tended to view the underlying dispersion forces that are responsible for the problem as "facts-of-life." Such efforts tend, therefore, to proceed by avoiding or working around dispersion forces through trial and error with appropriate design and fabrication approaches.

The solution to the problem of stiction remains elusive, and the art would benefit from new control methodologies.

SUMMARY OF THE INVENTION

Some embodiments of the present invention provide a method and apparatus for controlling or modulating the direction and/or magnitude of dispersion forces (e.g., Casimir force, etc.) between two bodies. Such dispersion forces are responsible for stiction, among other phenomena.

In accordance with the illustrative embodiment, an apparatus for modulating dispersion force gives rise to a repulsive Casimir force by placing two bodies (e.g., two plates, etc.) in near-proximity to one another, wherein, for one of the bodies, dielectric properties predominate; for the other, magnetic properties predominate. The apparatus further includes a device that alters the dielectric or magnetic properties of the bodies. By altering the dielectric or magnetic properties of at least one of the bodies, the repulsive Casimir force can be made to decrease, or vanish, or reappear as an attractive Casimir force.

In one variation of the illustrative embodiment, the altered property is a dielectric property, such as the concentration of free charge carriers in one of the bodies. The concentration of free-charge carriers is altered, for example, by illuminating the body, or changing the temperature of the body, or injecting charge directly into the body, etc. If the concentration of free-charge carriers is the altered property, then the device that alters that property is a laser (for illumination), or a heater/cooler (for changing temperature), or a controlled charge source (for injecting charge).

Modulating the Casimir force in this manner can be used to control stiction in MEMS devices and to accelerate particles, among many other applications.

DETAILED DESCRIPTION

Figure 1:
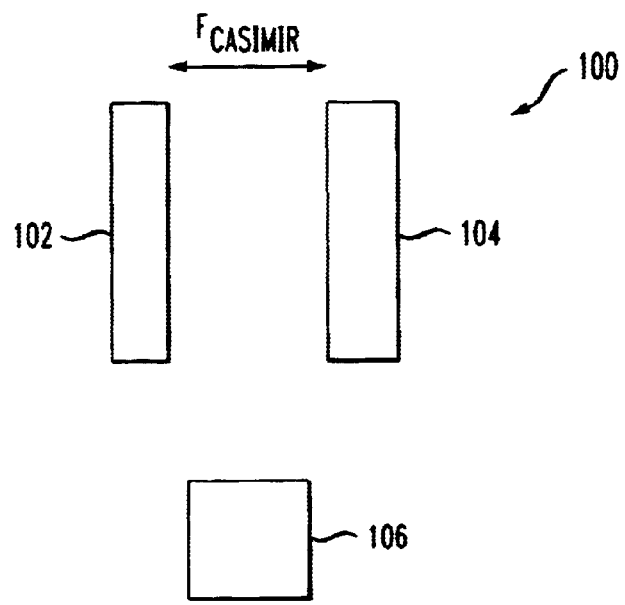
FIG. 1 depicts two surfaces and a dielectric/magnetic properties-altering device in accordance with the illustrative embodiment of the present invention.

For pedagogical purposes, the principles and theory underlying the present teachings will be described before addressing the illustrative embodiments.

Basic Principles

The realization that dispersion forces such as the van der Waals force and the Casimir force can manifest themselves as repulsive interactions originated from a speculation by Hendrik B. J. Casimir himself about the structure of the electron. According to Casimir's model, the electron can be viewed as a spherical shell that is held together by the attractive Casimir force against the self-repulsive force of its negative charge. This model was theoretically appealing because, among other things, it allowed for a very elegant interpretation of the fine structure constant:

$$\alpha = e^2/(h \cdot c) \qquad [1]$$

It was later discovered by Boyer that the total energy of a conducting spherical shell is, contrary to intuition, positive. That is, if the shell were to be cut into two halves, they would repel each other.

The first proof that repulsive dispersion forces may manifest themselves in technologically relevant situations was again given by Boyer, who was building upon a generalization of the theory of van der Waals forces. Making use of some important symmetries of Maxwell's equations under interchange of electric and magnetic fields, Boyer was able to show that two parallel plates of area A and separations, one of which is a perfect conductor while the other one is infinitely permeable, will repel which other with a force equal to:

$$F_{Casimir} = (7/8) \times (\pi^2 \cdot h \cdot c \cdot A)/(240 \cdot s^4) \qquad [2]$$

in the asymptotic retarded regime. This force is 7/8 of the typical attractive Casimir force between two perfectly conducting (or two infinitely permeable) plates.

These results represented a challenge to a well-known intuitive explanation of the Casimir force in terms of radiation pressure given by Milonni et al. In particular, the Casimir force between two perfectly-conducting parallel plates is satisfactorily explained by the fact that, because of the boundary conditions imposed by the two surfaces, the number of random modes of oscillation of the electromagnetic field will be larger in the volume of space outside of the plates than between them. That the force between a perfectly conducting medium and an infinitely permeable material is actually repulsive was explained within the traditional radiation-pressure framework by showing that the boundaries affect not only the number of modes of oscillation, but also their energy. Consequently, it is quite possible to have situations in which the total energy of a denumerable number of modes of oscillation of the electromagnetic field between the plates actually exceeds that of the continuum of modes outside.

Further research on these interesting and lesser-known regimes has been carried out recently for more general situations to include, for instance, the effects of temperature.

Illustrative Embodiment

In general, the Casimir and van der Waals (Casimir unretarded) forces depend on both the electric and magnetic properties of, for instance, the two parallel plates facing each other at a distances. It is known that two plates, including two dielectric plates or two perfectly conducting ones (dielectric constant $\epsilon \rightarrow \infty$), as well as two infinitely permeable plates (magnetic permeability $\mu \rightarrow \infty$), will attract each other, while a perfectly conducting one and an infinitely permeable one will repel each other.

Based on the theory described above, the present inventor has recognized that an article comprising a pair of parallel surfaces having an appropriate combination of electric and magnetic properties ($\epsilon_1$, $\mu_1$, and $\epsilon_2$, $\mu_2$) can give rise to a repulsive, attractive, or vanishing Casimir force. In accordance with the present teachings, by inducing changes in the properties of such surfaces (see, "Method and Apparatus for Energy Extraction," filed May 25, 2000 as Ser. No. 09/578, 638 and "Method and Apparatus for Particle Acceleration," filed May 25, 2000 as Ser. No. 09/578,639, both of which are incorporated herein by reference), the nature of the Casimir force interaction—repulsive, attractive or vanishing—is modulated.

FIG. 1 depicts arrangement 100 comprising two surfaces or plates 102 and 104 and dielectric/magnetic properties-altering device 106.

The properties of plate 102 are adequately described by a dielectric function; that is, the magnetic characteristics of plate 102 are insignificant relative to the dielectric properties in terms of characterizing the behavior of that plate. Conversely, the properties of plate 104 are adequately described by the magnetic properties. For such a scenario, the Casimir force is repulsive.

In one variation in accordance with the illustrative embodiment, the dielectric characteristics of plate 102 are altered via device 106. One example of a dielectric characteristic that is altered is the concentration of free charge carriers in plate 102. The concentration of free charge carriers can be altered, for example, by changing the temperature of the plate. In such an embodiment, device 106 is, without limitation, a heater. In an alternative implementation, the concentration of free charge carriers in plate 102 is altered by illuminating the plate. In such an implementation, device 106 is, without limitation, a laser.

As the dielectric properties are, for example, decreased in significance relative to the magnetic properties the repulsive force decreases. Eventually, the Casimir force vanishes and, as the magnetic properties of plate 104 dominate, the Casimir force between the plates becomes attractive (because, as previously stated, the Casimir force between two permeable plates is attractive). In a further variation in accordance with the illustrative embodiment, the magnetic properties of the plate 104 are altered in known fashion to the same end (i.e, a decrease in repulsive Casimir force, nulling the force, and then the Casimir force becomes attractive).

The method described herein for modulating the nature of the Casimir force (i.e., repulsive, null, or attractive) has many important industrial applications, a few of which are described below. Those skilled in the art will be able to adapt the basic arrangement 100 and method described above, as required, for use in such applications.

In a conventional procedure, a microstructure being fabricated, such as a micro-bridge, is released from an underlying sacrificial layer by removing the sacrificial layer with an etchant. As the etchant removes the sacrificial layer, the micro-bridge is drawn towards the substrate such that they might adhere to one another (i.e., stiction).

In a first variation in accordance with the illustrative embodiment, microstructures that are not affected by stiction are fabricated. In accordance with the illustrative embodiment, environmental factors (e.g., ambient temperature, illumination conditions, etc.) are controlled to give rise to a repulsive Casimir force, in the manner previously described, between the micro-bridge and the substrate.

Figure 2:
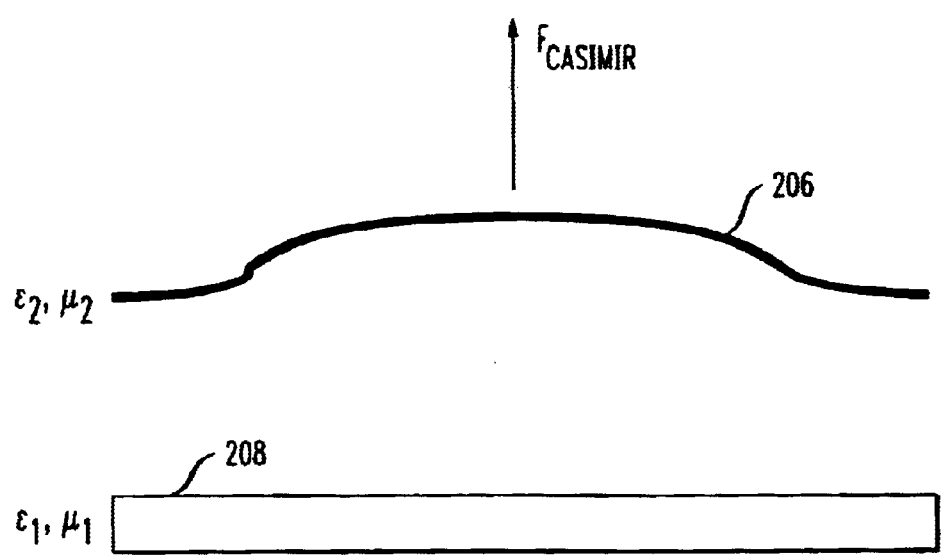
FIG. 2 depicts a first variation of the illustrative embodiment wherein micro-bridge comprising a highly permeable material overlies a silicon substrate.

The micro-bridge is advantageously formed of a highly permeable semiconducting material, so that the micro-bridge actively repels both the etchant (dielectric) and the substrate itself (typically silicon), therefore significantly decreasing the likelihood of stiction. FIG. 2 depicts micro-bridge 206 comprising a highly permeable material having respective dielectric and magnetic properties ($\epsilon_2$, $\mu_2$) and a silicon substrate 208 having respective dielectric and magnetic properties ($\epsilon_1$, $\mu_1$). The Casimir force between micro-bridge 206 and substrate 208 is repulsive.

In a second variation in accordance with the illustrative embodiment, the distance between, for example, the micro-bridge and the underlying substrate, is changed by altering the dielectric function of a semiconducting material that composes the micro-bridge (or the substrate). This capability can be used, for instance, to alter the shape of the micro-bridge such as for optics applications, to actuate devices such as micro-cantilevers, and to operate motors, which would work without the use of electric currents.

Figure 3:
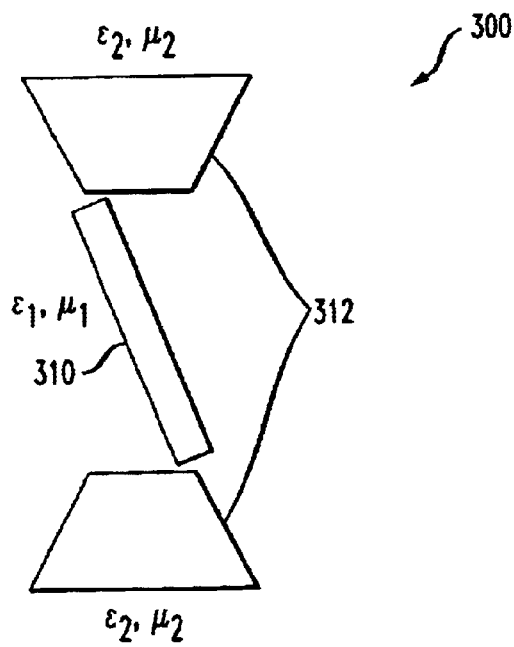
FIG. 3 depicts a motor in accordance with a second variation of the illustrative embodiment of the present invention.

FIG. 3 depicts motor 300 having a dielectric rotor 310 that has respective dielectric and magnetic properties ($\epsilon_1$, $\mu_1$) and magnetic semiconducting structures 312 having respective dielectric and magnetic properties ($\epsilon_2$, $\mu_2$). Suitably changing the dielectric function every half cycle, such as in the manner previously described, causes the Casimir force on rotor 310 to reverse from attractive to repulsive.

In further variations, an ability to determine the shape of microstructures is enhanced by creating gradients in the physical properties of the semiconducting materials involved. Such gradients can be created using, for example, dopants. This advantageously allows the Casimir force on some portions of the materials to be attractive while it is repulsive elsewhere at the same time. This facilitates the fabrication of adaptive micro-opto-electromechanical systems, with, for instance, greatly increased telecommunications applications.

In yet further variations, devices making use of repulsive Casimir forces can be used as sensors, since the magnitude/direction of the force depends on all relevant environmental physical parameters. For example, the net force, etc., acting on a sensing surface is determined by the dielectric properties of a nearby surface.

In still further variations of the illustrative embodiment, improved micro-propulsion devices are fabricated. Illustrative of such devices are palm-sized satellites, "smart-dust," etc., that are propelled by expelling small pellets or droplets of material sans explosive chemical reactions. Since, in accordance with the illustrative embodiment, the Casimir force can be modulated from repulsive to attractive, the propulsive system is readily reloaded, a feature that is not available in presently existing on-chip micro-propulsive systems.

Figure 4:
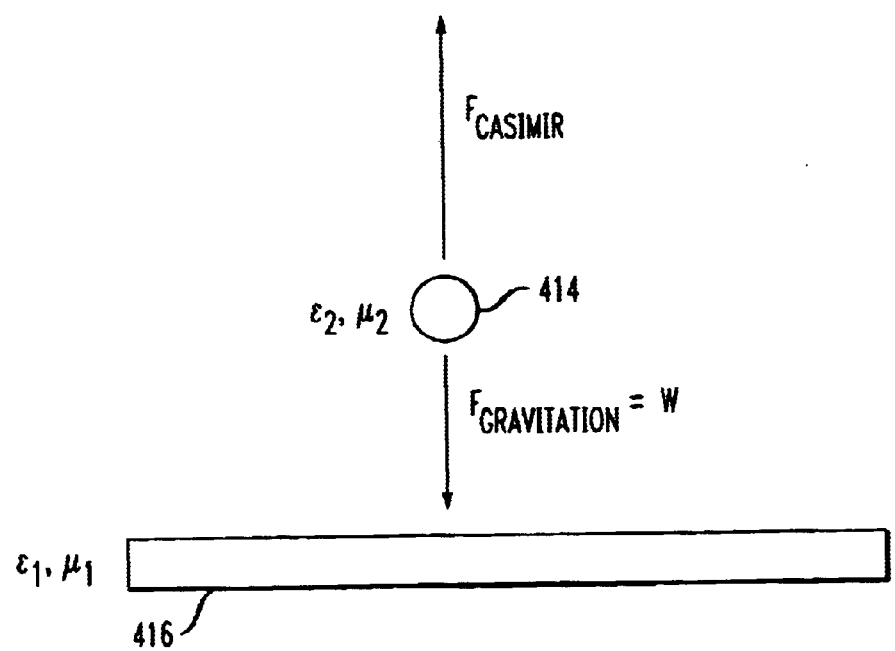
FIG. 4 depicts a levitator in accordance with a third variation of the illustrative embodiment of the present invention.

In additional variations, Casimir-force levitators are realized. As depicted in FIG. 4, dielectric droplet 414 is in equilibrium in the field of the repulsive Casimir force that exactly balances the gravitational force on the droplet. The repulsive Casimir force is created due to the proximity of magnetic semiconductor substrate 416 to the dielectric droplet. Changing the dielectric properties of the substrate causes the droplet to fall, rise or be shot away permanently.

Figure 5A:
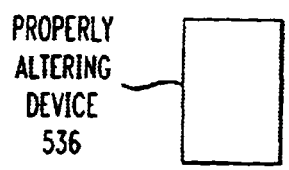
FIG. 5A depicts a Casimir-force actuated optical switch in accordance with a fourth variation of the illustrative embodiment, wherein the optical switch is in the bar state.
Figure 5A:
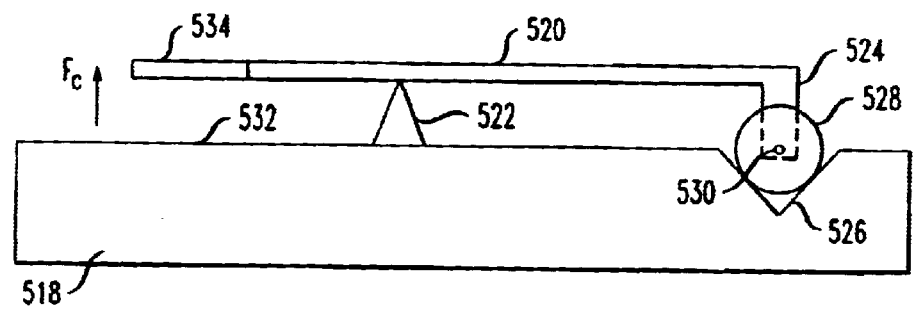

In more variations, switches (e.g., optical switches, etc.) are fabricated using the present method. An example of a switch 500 is depicted in FIGS. 5A (bar state) and 5B (cross state). The switch comprises substrate 518, and movable member 520 that is supported at pivot 522. Shutter 524 depends from movable member 520. V-groove 526 receives first optical fiber 528 and a second optical fiber (not pictured). First optical fiber 528 has fiber core 530. Shutter 524 is aligned with a gap between first optical fiber 528 and the second optical fiber.

In a bar state of the switch depicted in FIG. 5A, an optical signal is "barred" from passing between the first and second optical fibers since shutter 524 extends downward into the gap between the fibers. To place the switch in the bar state, a repulsive Casimir force $F_c$ is generated between region 532 of substrate 518 and region 534 of movable member 520. Due to this repulsion, region 534 moves away from region 532 of the substrate. Due to the presence of pivot 522, shutter 524 moves downward into the gap between the fibers as region 534 moves away from region 532 of the substrate.

Figure 5B:
FIG. 5B depicts the optical switch of FIG. 5A in the cross state.
Figure 5B:
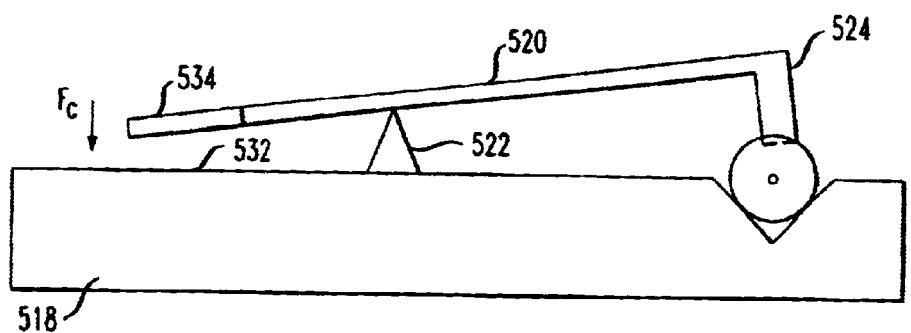

In a cross state of the switch depicted in FIG. 5B, an optical signal is free to "cross" the gap between the first and second optical fibers since shutter 524 is not in the gap therebetween. To place the switch in the cross state, an attractive Casimir force $F_c$ is generated between region 532 of substrate 518 and region 534 of movable member 520. Due to this attraction, region 534 moves toward region 532 of substrate 518. Due to the presence of pivot 522, shutter 524 moves upward out of the gap between the fibers as region 534 moves toward region 532 of the substrate.

One of regions 534 and 532 (or the full substrate 518 and movable member 520) is suitably dielectric and the other is suitably magnetically permeable, as previously described. Property-altering device 536 is used to effect a change in the dielectric or magnetic properties of regions 534 or 532 to cause the required change in the direction of Casimir force $F_c$.

The engine cycles for energy conversion and production described in co-pending patent application Ser. No. 09/578,638 filed May 25, 2000, and the methods and arrangements for particle acceleration and deceleration described in co-pending patent application Ser. No. 09/578,639 filed May 25, 2000, can be reformulated within and extended to the context of repulsive Casimir forces, as described herein.

All the above examples have great importance in MEMS engineering as they enable the fabrication of microstructures that, formerly, have not be possible. Furthermore, the concept of repulsive surface forces enables completely new schemes for actuation, sensing, telecommunications, micro-propulsion and energy conversion and production.

It is to be understood that the above-described embodiments and variations thereon are merely illustrative of the present invention and that many additional variations can be devised by those skilled in the art without departing from the scope of the invention. It is therefore intended that such variations be included within the scope of the following claims and their equivalents.

I claim:

1. An article comprising:

a first dielectric plate that is satisfactorily characterized by dielectric properties alone;

a second magnetically permeable plate that is satisfactorily characterized by magnetic properties alone; and a device for altering at least one of either the dielectric properties of said first dielectric plate and the magnetic properties of said second magnetically permeable plate.

2. The article of claim 1 wherein said device is a laser.

3. The article of claim 1 wherein said device is a heater.

4. A method comprising:

providing a first dielectric plate that is satisfactorily characterized by dielectric properties alone;

providing a second magnetically permeable plate that is satisfactorily characterized by magnetic properties alone;

altering the dielectric properties of said first dielectric plate.

5. The method of claim 4 wherein the step of altering further comprises reducing a concentration of free charge carriers in said first dielectric plate.

6. The method of claim 4 wherein said dielectric properties are altered such that a Casimir force acting between said first dielectric plate and said second magnetically permeable plate is attractive.

* * * * *